(12) United States Patent
Dey

(10) Patent No.: US 9,035,692 B2
(45) Date of Patent: May 19, 2015

(54) COMPLEMENTARY BIASING CIRCUITS AND RELATED METHODS

(71) Applicant: Aritra Dey, Folsom, CA (US)

(72) Inventor: Aritra Dey, Folsom, CA (US)

(73) Assignee: Arizona Board of Regents, a body corporate of the State of Arizona, Acting for and on Behalf of Arizona State University, Scottsdale, AZ (US)

( * ) Notice: Subject to any disclaimer, the term of this patent is extended or adjusted under 35 U.S.C. 154(b) by 135 days.

(21) Appl. No.: 13/798,796

(22) Filed: Mar. 13, 2013

(65) Prior Publication Data

US 2014/0070868 A1 Mar. 13, 2014

Related U.S. Application Data

(63) Continuation of application No. PCT/US2011/054570, filed on Oct. 3, 2011.

(60) Provisional application No. 61/389,555, filed on Oct. 4, 2010.

(51) Int. Cl.
*G05F 3/24* (2006.01)
*G06G 7/14* (2006.01)
*H03F 1/30* (2006.01)

(52) U.S. Cl.
CPC .. *G06G 7/14* (2013.01); *G05F 3/24* (2013.01); *H03F 1/301* (2013.01); *H03F 2203/45244* (2013.01)

(58) Field of Classification Search
CPC .................................. G06G 7/14; H03F 1/301

USPC .................................... 327/539, 513; 323/313
See application file for complete search history.

(56) References Cited

U.S. PATENT DOCUMENTS

| | | | | |
|---|---|---|---|---|
| 4,679,062 A * | 7/1987 | Okamoto | ......................... | 257/59 |
| 5,034,626 A * | 7/1991 | Pirez et al. | ..................... | 327/542 |
| 5,604,427 A * | 2/1997 | Kimura | ......................... | 323/313 |
| 5,818,294 A * | 10/1998 | Ashmore, Jr. | ................. | 327/543 |
| 6,107,868 A * | 8/2000 | Diniz et al. | .................... | 327/543 |
| 6,300,659 B1 * | 10/2001 | Zhang et al. | ................... | 257/347 |
| 6,492,795 B2 * | 12/2002 | Engl | .............................. | 323/312 |
| 6,914,831 B2 * | 7/2005 | Di Iorio | .................. | 365/189.09 |
| 6,958,597 B1 * | 10/2005 | Lin et al. | ........................ | 323/313 |
| 7,034,514 B2 * | 4/2006 | Tachibana et al. | ............ | 323/313 |
| 7,071,670 B1 * | 7/2006 | Hidri et al. | ..................... | 323/313 |
| 7,110,729 B1 * | 9/2006 | Dash | ........................... | 455/127.1 |
| 7,161,440 B2 * | 1/2007 | Meltzer | ............................ | 331/76 |
| 7,511,567 B2 * | 3/2009 | Yeo et al. | ....................... | 327/539 |
| 7,667,533 B1 * | 2/2010 | Tan et al. | ....................... | 327/541 |
| 8,054,156 B2 * | 11/2011 | Fort et al. | ........................... | 338/7 |
| 8,680,840 B2 * | 3/2014 | Iacob et al. | ..................... | 323/313 |
| 2001/0028278 A1 * | 10/2001 | Ooishi | ............................. | 331/57 |
| 2002/0036536 A1 | 3/2002 | Wada et al. | | |

(Continued)

FOREIGN PATENT DOCUMENTS

JP 2007128553 5/2007

OTHER PUBLICATIONS

International Search Report for PCT Application No. PCT/US2011/054570, 5 pages, Jul. 30, 2012.

*Primary Examiner* — Thomas J Hiltunen
(74) *Attorney, Agent, or Firm* — Bryan Cave LLP

(57) ABSTRACT

Embodiments of complementary biasing circuits and related methods are described herein. Other embodiments and related implementations are also disclosed herein.

27 Claims, 5 Drawing Sheets

(56) References Cited

U.S. PATENT DOCUMENTS

2004/0104760 A1 6/2004 Ando
2004/0207380 A1* 10/2004 Ariki .............................. 323/313
2008/0054258 A1* 3/2008 Koenemann et al. ........... 257/40
2009/0153214 A1* 6/2009 Takatori ........................ 327/262
2012/0056609 A1* 3/2012 Satoh ............................ 323/313
2012/0119819 A1* 5/2012 Pyo et al. ....................... 327/513

* cited by examiner

COMPLEMENTARY BIASING CIRCUITS AND RELATED METHODS

CROSS REFERENCE TO RELATED APPLICATION(S)

This patent application is a continuation of International Patent Application No. PCT/US2011/054570, filed on Oct. 3, 2011, which claims priority to U.S. provisional patent application No. 61/389,555, filed on Oct. 4, 2010. The contents of the disclosures listed above are incorporated herein by reference.

GOVERNMENT FUNDING

The disclosure herein was funded with government support under W911NF-04-2-0005, awarded by the Army Research Office. The United States Government may have certain rights in this application.

TECHNICAL FIELD

This invention relates generally to semiconductor devices and methods of providing semiconductor devices, and relates, more particularly, to complementary biasing circuits and related methods.

BACKGROUND

Operational amplifiers can be used to create large area interface electronics, such as complex data converters (both analog to digital and digital to analog) for applications such as large area sensors. Thin film transistors (TFTs), however, suffer from stress degradation upon exposure through time to gate bias stress voltage. In some TFT's, the two main causes of stress degradation can be attributed to 1) defect state creation due to Si dangling bonds and 2) charge trapping in the $SiN_x$ insulator. Due to stress degradation of the TFTs, corresponding operational amplifier performance degrades with time, thus limiting or restricting the viability or lifetime of corresponding applications.

Therefore, a need exists in the art to develop biasing apparatuses and related methods for TFT transistors that will limit, restrict, and/or delay the effect of TFT stress degradation on biasing signals provided to target circuits like operational amplifiers.

BRIEF DESCRIPTION OF THE DRAWINGS

To facilitate further description of the embodiments, the following drawings are provided in which.

Figure 1:
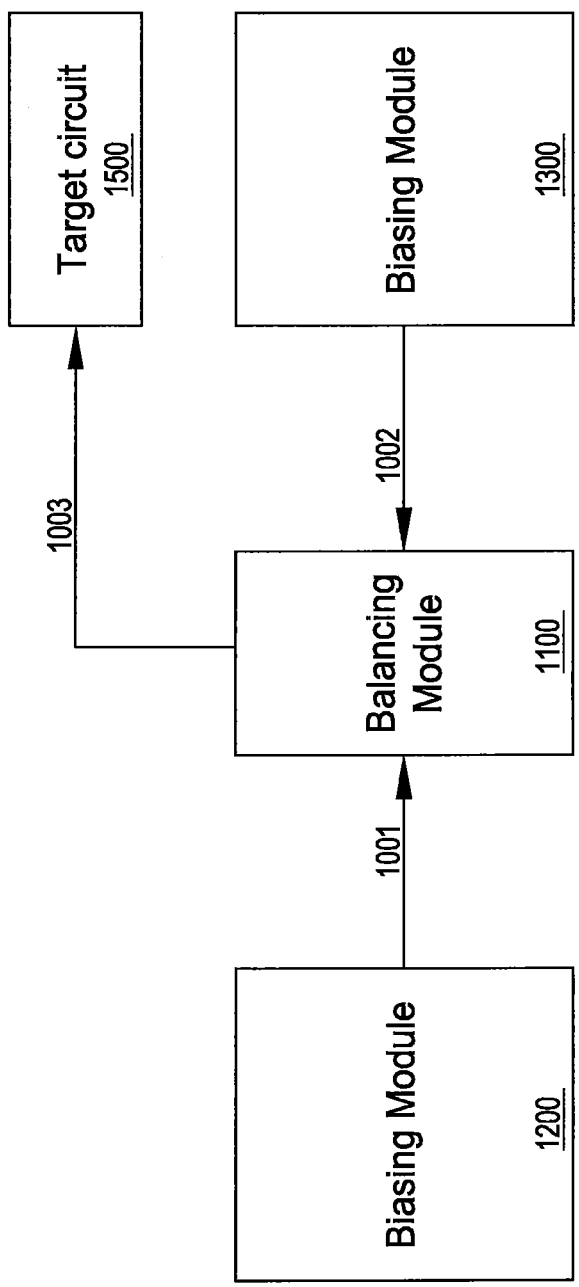
FIG. 1 illustrates a high level diagram of a biasing apparatus in accordance with the present disclosure.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DESCRIPTION

In one embodiment, a biasing apparatus can comprise a first biasing module configured to output a first biasing signal, a second biasing module configured to output a second biasing signal, and a balancing module comprising a first input to receive the first biasing signal, a second input to receive the second biasing signal, and an output terminal to output to a target circuit an output biasing signal derived from the first and second biasing signals.

In one example, a method can comprise providing a first biasing module configured to output a first biasing signal, providing a second biasing module configured to output a second biasing signal, and providing a balancing module to output an output biasing signal derived from an inverse relationship between the first and second biasing signals.

In one embodiment, a biasing apparatus can comprise a first biasing module configured to output a first biasing signal, a second biasing module configured to output a second biasing signal, and a balancing module coupled between the first and second biasing modules to output an output biasing signal derived from the first and second biasing signals. The first and second biasing modules can comprise n-type and p-type thin film transistors susceptible to threshold voltage degradation. The first biasing module can comprise an n-channel $g_m$ biasing topology, with a first biasing transistor pair of the n-type thin film transistors. The second biasing module can comprise a p-channel $g_m$ biasing topology, with a second biasing transistor pair of the p-type thin film transistors. A first threshold voltage difference, between threshold voltages of the first biasing transistor pair, can be configured to increase when the first biasing transistor pair is exposed to a first gate stress voltage such as to make the first biasing transistor pair increasingly more difficult to turn on. A second threshold voltage difference, between threshold voltages of the second biasing transistor pair, can be configured to decrease when the second biasing transistor pair is exposed to a second gate stress voltage such as to make the second biasing transistor pair increasingly less difficult to turn on. The first biasing module can be configured to increase the first biasing signal in magnitude as the first threshold voltage difference increases, and the second biasing module can be configured to decrease the second biasing signal in magnitude as the second threshold voltage difference decreases. The balancing module can be configured to generate a sum current from a sum of (a) a first current controlled by the first biasing signal and (b) a second current controlled by the second biasing signal. The sum current can remain substantially constant as the first biasing signal increases while the second biasing signal decreases substantially proportional to each other. The output biasing signal can remain substantially constant while the sum current remains substantially constant.

Other examples and embodiments are further disclosed herein. Such examples and embodiments may be found in the figures, in the claims, and/or in the description of the present application.

Moving on to the figures, FIG. 1 presents a diagram of biasing apparatus 1000 in accordance with the present disclosure. In the present example, biasing apparatus 1000 comprises biasing module 1200, biasing module 1300, and balancing module 1100. Biasing module 1200 is configured to output biasing signal 1001 to balancing module 1100, and biasing module 1300 is configured to output biasing signal 1002 to balancing module 1100. Balancing module 1100 is configured to provide biasing signal 1003 to target circuit 1500 to bias one or more components thereof, where biasing signal 1003 is derived by balancing module 1100 from both biasing signals 1001 and 1002. Biasing signal 1003 can be referred to as an output biasing signal in some embodiments.

In some embodiments, one or more of balancing module 1100, biasing module 1200, or biasing module 1300 can comprise thin film transistors (TFTs). There can be examples where the biasing apparatus 1000 can comprise p-type transistors and n-type transistors. In some examples, the p-type TFTs can comprise a pentacene material, and/or the n-type TFTs can comprise an amorphous silicon material or a zinc oxide material, such as indium zinc oxide. In the same or other examples, one of biasing modules 1200 or 1300 can comprise an n-channel $g_m$ biasing topology, while a different one of biasing modules 1200 or 1300 can comprise a p-channel $g_m$ biasing topology. In the same or other examples, target circuit 1500 can comprise an operational amplifier that can be biased by biasing signal 1003.

In some examples, target circuit 1500 could be biased by only one of biasing signal 1001 from biasing module 1200, or by biasing signal 1002 from biasing module 1300. There can be examples, however, where one or more transistors of biasing modules 1200 and/or 1300 could comprise TFT transistors susceptible to the degradation phenomenon. In such examples, to limit or restrict the effect of such degradation on the biasing signal received by target circuit 1500, biasing modules 1200 and 1300 can be configured to be complementary to each other, such that as biasing signal 1001 increases as a result of TFT degradation in biasing module 1200, biasing signal 1002 decreases as a result of TFT degradation in biasing module 1300. Balancing module 1100 can thus be configured to sum or otherwise balance or combine biasing signals 1001 and 1002 to generate biasing signal 1003, thereby maintaining biasing signal 1003 substantially constant as a result of the complementary changes of biasing signals 1001 and 1002 relative to each other. In some examples, balancing module 1100 can maintain biasing signal 1003 substantially constant until TFT degradation in biasing module 1300 causes a magnitude of biasing signal 1002 to reach or be substantially proximate to zero.

Figure 2:
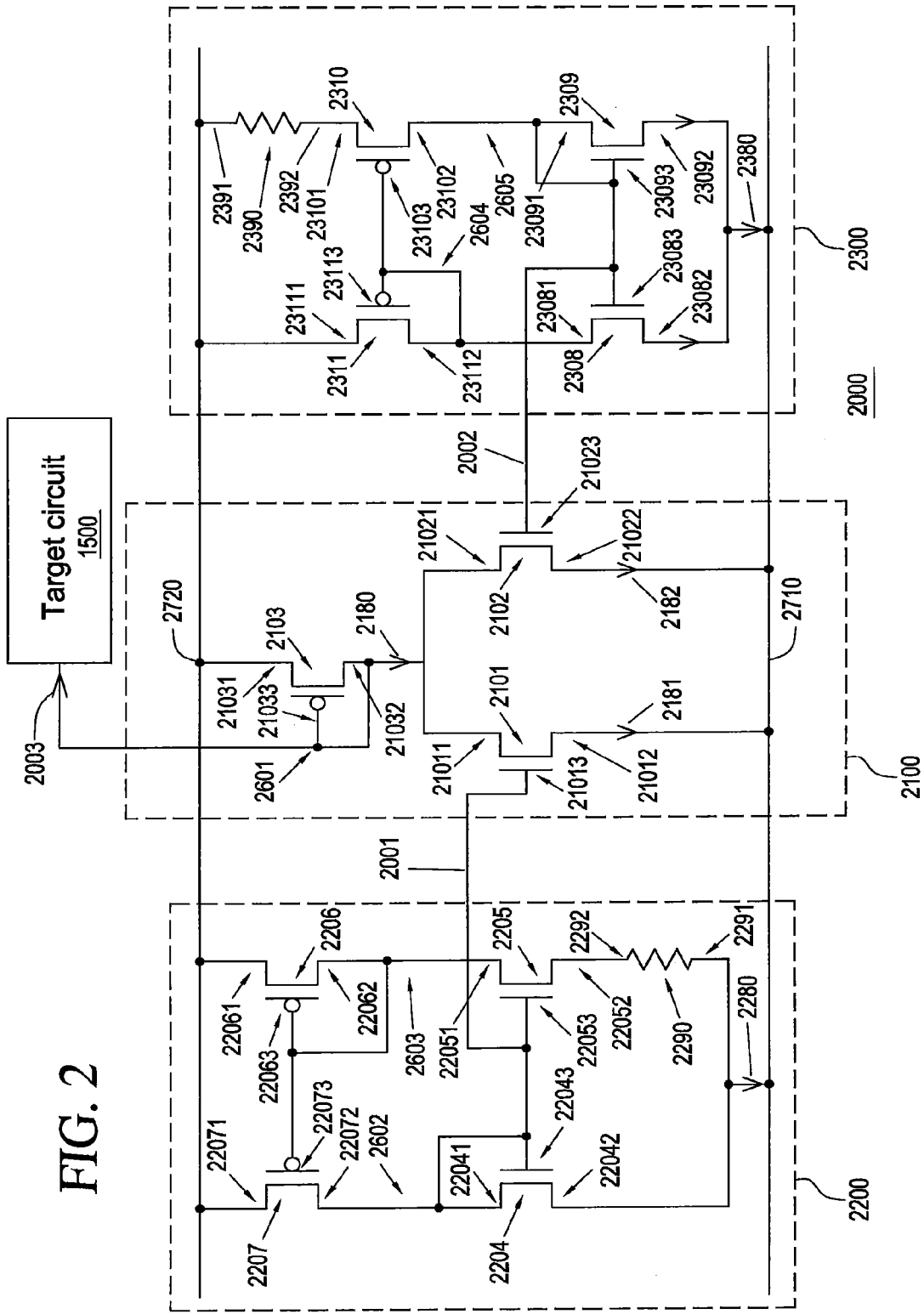
FIG. 2 illustrates a transistor level schematic of a biasing apparatus in accordance with the diagram of FIG. 1.

FIG. 2 illustrates a diagram of biasing apparatus 2000 in accordance with the present disclosure. Biasing apparatus 2000 is similar to biasing apparatus 1000 (FIG. 1), sharing a similar architecture. For example, biasing module 2200 of biasing apparatus 2000 can be similar to biasing module 1200 of biasing apparatus 1000 in FIG. 1. Biasing module 2300 of biasing apparatus 2000 can be similar to biasing module 1300 of biasing apparatus 1000 in FIG. 1. Balancing module 2100 of biasing apparatus 2000 can be similar to balancing module 1100 of biasing apparatus 1000 in FIG. 1. In addition, biasing signals 2001-2003 can be respectively similar to biasing signals 1001-1003 of biasing apparatus 1000 in FIG. 1.

In the present example of FIG. 2, biasing module 2200 comprises a constant $g_m$ biasing circuit. In the same or other examples, the effect of TFT degradation can on biasing modules, such as biasing module 2200, can be defined illustrated by looking at how the current through the biasing module increases because of the degradation. The degradation of the individual TFTs can follow a stretched exponential equation like equation (1) below, where $\tau$ and $\beta$ are parameters can be extracted from experimental results.

$$\Delta V_T(t) = (V_{GS} - V_T)\left[1 - \exp\left\{-\left(\frac{t}{\tau}\right)^\beta\right\}\right] \quad (1)$$

Considering the constant $g_m$ biasing circuit shown for biasing module 2200 we can show that the bias current increases, thereby increasing the power, reducing the output signal swing and reducing the designed phase margin of the op-amp. This increase is a result of transistors 2204 and 2205 aging differently in FIG. 2. In the following equations, elements having subscript "1" relate to transistor 2204, and elements having subscript "2" relate to transistor 2205. Transistors 2204 and 2205 have different gate to source voltages ($V_{GS}$), which lead to different threshold voltages over time. For a constant $g_m$ biasing circuit, the $V_{GS1}$ of transistor 2204 and $V_{GS2}$ of transistor 2205 at any time t are related by equation (2) as follows:

$$V_{GS1}(t) = V_{GS2}(t) + I_{DS}(t)R \quad (2)$$

where R is resistance 2290 in FIG. 2. For TFTs in saturation, equation (2) can be written as per equation (3) as follows:

$$\sqrt{\frac{2I_{DS}}{\mu(W/L)_1 C_{ox}}} + V_{T1} = \sqrt{\frac{2I_{DS}}{\mu(W/L)_2 C_{ox}}} + V_{T2} + I_{DS}R \quad (3)$$

Because initially $V_{GS1} > V_{GS2}$ (from equation (2)), the threshold voltage of transistor 2204 ($V_{T1}$) will degrade more than the threshold voltage of transistor 2205 ($V_{T2}$) following equation (1), such that the threshold voltage difference ($\Delta V_T = V_{T1} - V_{T2}$) will increases with time. This in turn, from equation (3), implies that current $I_{DS}$ in both legs of the constant $g_m$ biasing circuit increases, resulting in an increase in the gate overdrive voltage ($V_{OV} = V_{GS} - V_T$). An increased $V_{OV}$ results in reduced signal output signal swing for the biased operational amplifier in target circuit 1500. Also increase in $I_{DS}$ results in further increase in $V_{GS1} - V_{GS2}$ and this effect feeds on itself. A simple analytical expression to predict the evolution of $I_{DS}$ with time can be derived as follows. From equation (2), we can derive equation (4) as:

$$\sqrt{2I_{DS}}(\sqrt{M_1} - \sqrt{M_2}) = I_{DS}R - \delta V_T \quad (4)$$

where $M_{1,2} = (\mu(W/L)_{1,2} C_{ox})^{-1}$ and $\delta V_T = V_{T1} - V_{T2}$. Now, for a constant $g_m$ bias circuit we have $M_1 = 4M_2$. So equation (4) can be solved for $I_{DS}$ in equation (5) as follows:

$$I_{DS}(t) = \frac{\delta V_T}{R} + \frac{M_2}{R^2} + \sqrt{\frac{M_2^2}{R^4} + \frac{2\delta V_T M_2}{R^3}} \quad (5)$$

Note that equation (5) reduces to $g_{m1} = 1/R$ when $W_T = 0$. An expression for $\delta V_T$ can be derived as per equation (6):

$$\delta V_T = V_T + \Delta V_{T1} - (V_T + \Delta V_{T2}) \quad (6)$$

Here $\Delta V_{T1,2}$ denotes the change in $V_T$ (initial threshold voltage of both devices) due to gate bias stress. Substituting expression for $\Delta V_{T1,2}$ from equation (1), we arrive at equation (7):

$$\delta V_T = (V_{GS1} - V_{GS2})_{initial} f(t) = I_{DS(initial)} R f(t) \quad (7)$$

where $$f(t) = \left[1 - \exp\left\{-\left(\frac{t}{\tau}\right)^\beta\right\}\right].$$

Substituting $\Delta V_{T1,2}$ expressions from equation (7), we derive an expression for the final $I_{DS}$ in equation (8):

$$I_{DS}(t)(1/2 + f(t))I_{DS(initial)} + \sqrt{\frac{I_{DS(initial)}^2}{4} + I_{DS(initial)}^2 f(t)} \quad (8)$$

Figure 3:
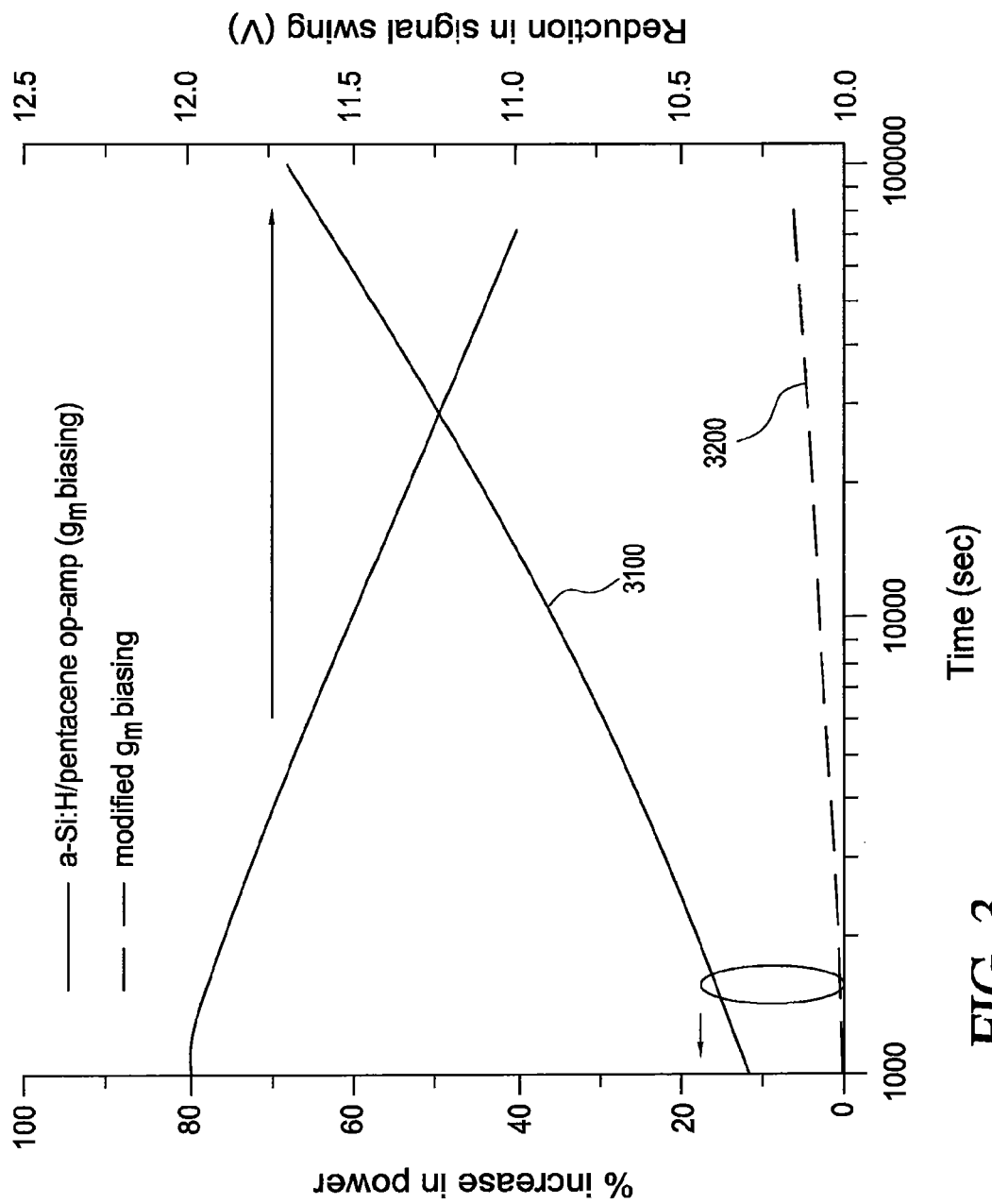
FIG. 3 illustrates a comparison chart of operational amplifier power consumption increase due to transistor degradation.

This increase in current is reflected as increase in power consumption and reduction in signal swing, as shown in FIG. 3.

The novel biasing scheme shown for FIGS. 1 and 2 can restrict or delay such power consumption increase due to TFT degradation, as seen from the comparison graph of FIG. 3, where line 3100 represents an increase in power consumption for an operational amplifier biased only via a constant $g_m$ biasing circuit, and where line 3200 represents the reduced, restricted and/or delayed power consumption increase for the operational amplifier when biased via biasing signal 2003 of biasing apparatus 2000 (FIG. 2).

In the n-channel $g_m$ biasing topology of biasing module 2200, an increase in $I_{DS}$ is due to differential aging of n-channel transistors 2204 and 2205, and $\Delta V_T$ increases with time for n-channel TFTs (i.e. it becomes harder to turn on the TFTs). In the p-channel $g_m$ biasing topology of biasing module 2300, a similar decrease in $I_{DS}$ is brought about by differential aging of p-channel transistors 2311 and 2310. This decrease is due to increasingly negative $\Delta V_T$ for p-channel TFTs (i.e., it becomes easier to turn on the TFTs). As a result, if $I_{DS}$ 2280 in biasing module 2200 increases commensurate with the decrease of $I_{DS}$ 2380 in biasing module 2300, sum current ($I_{sum}$) 2180 flowing through transistor 2103 will remain more or less constant. In practice, $I_{sum}$ 2180 may not remain exactly constant, for the rate of degradation ($f_n(t)$ and $f_p(t)$ for n and p channel respectively) are different for the different materials. If $f_n(t) > f_p(t)$, as for a-Si:H and pentacene, $I_{sum}$ 2180 will increase slightly, although much less than if the degradation of biasing module 2300 were not used to counteract the degradation in biasing module 2300. On the other hand, if $f_p(t) > f_n(t)$, as for ZnO and pentacene, $I_{sum}$ 2180 would decrease slightly. Because current decreases in the p-channel $g_m$ biasing topology of biasing module 2300, this type of architecture is valid until $I_{DS}$ 2380 decreases to very low value. Nevertheless, as seen in FIG. 3, where the dashed line shows a simulated increase in power for a-Si:H/pentacene op-amps, the increase in power due to the TFT degradation is at least significantly delayed by using the type of biasing circuits of FIGS. 1-2.

Continuing with FIGS. 1-2, in light of the discussion above, biasing signal 2001 will increase as transistors 2204 and 2205 degrade, and biasing signal 2002 will decrease as transistors 2310 and 2311 degrade. As long as biasing signal 2002 can decrease while biasing signal 2001 increases, biasing signal 2003 can be kept substantially constant by balancing module 2100.

As can be seen in the embodiment of FIG. 2, biasing module 2200 comprises transistors 2204 and 2205 as a biasing transistor pair of n-type transistors, while biasing module 2300 comprises transistors 2310 and 2311 as a biasing transistor pair of p-type transistors. In the present example, transistors 2204 and 2205 comprise different dimensions, and thus degrade at different rates when exposed to gate stress voltages. Similarly, transistors 2310 and 2311 comprise different dimensions, and also degrade at different rates when exposed to gate stress voltages. In some examples, a channel width of transistor 2205 may be approximately 4 times greater than a channel width of transistor 2204. Similarly, a channel width of transistor 2310 may be approximately 4 times greater than a channel width of transistor 2311.

As transistors 2204 and 2205 degrade at different rates when stressed, the threshold voltage difference $\Delta V_T$ between them increases, such that the threshold voltage of transistor 2204 increases more than the threshold voltage of transistor 2205. As a result, transistor 2204 becomes increasingly more difficult to turn on than transistor 2205, such that more current flows through transistor 2205 than through transistor 2204, causing the gate voltage of transistor 2205 to increase. Accordingly, a voltage of biasing signal 2001 is therefore increased.

Conversely, as transistors 2310 and 2311 degrade at different rates, the threshold voltage difference $\Delta V_T$ between them increases, such that the threshold voltage of transistor 2311 increases more than the threshold voltage of transistor 2310. As a result, transistor 2311 becomes increasingly less difficult to turn on than transistor 2310, such that less current flows through transistor 2310. Accordingly, a voltage of biasing signal 2002 is therefore decreased.

In some examples, transistors 2204 and 2205 can comprise amorphous silicon nmos TFTs, and the threshold voltage difference $\Delta V_T$ between transistors 2204 and 2205 can increase from approximately 0 Volts (V) to approximately 2V when the gates of transistors 2204 and 2205 are exposed to a gate voltage of approximately 15V, relative to power node 2710, throughout a stress time of approximately 5000 seconds. In the same or other examples, transistors 2310 and 2311 can comprise pentacene pmos TFTs, and the threshold voltage difference $\Delta V_T$ between transistors 2310 and 2311 can increase from approximately 0V to approximately 1.3V when the gates of transistors 2310 and 2311 are exposed to a gate voltage of approximately −15V, relative to power node 2720, throughout the stress time.

In the present example, balancing module 2100 can maintain biasing signal 2003 constant by maintaining $I_{sum}$ 2180 constant, where $I_{sum}$ 2180 comprises a sum of current 2181 through transistor 2101 and of balancing current 2182 through transistor 2102. Balancing current 2181 is controlled by biasing signal 2001, where biasing signal 2001 increasingly actuates transistor 2101 as biasing signal 2001 increases as described above, such that the flow of balancing current 2181 through transistor 2101 also increases accordingly. Conversely, balancing current 2182 is controlled by biasing signal 2002, where biasing signal 2002 decreasingly actuates transistor 2102 as biasing signal 2002 decreases as described above, such that the flow of balancing current 2182 through transistor 2102 also decreases accordingly. Therefore, because the increase in balancing current 2181 is substantially offset by the decrease in balancing current 2182, $I_{sum}$ 2180 can remain constant, such that biasing signal 2003 can also remain constant even as the transistors of biasing modules 2200 and 2300 degrade.

There can be embodiments where, as previously described, balancing module 2100 will delay the effects of TFT degradation and keep $I_{sum}$ 2180 substantially constant as long as currents 2181-2182 remain within respective current ranges. For example, currents 2181 and 2182 may initially start out approximately equal to each other. With use, however, balancing current 2181 will begin to increase, while balancing current 2182 will begin to decrease, and $I_{sum}$ 2180 will remain substantially constant while the decrease in balancing current 2182 substantially matches the increase in current 2181.

Looking at the implementation of biasing apparatus 2000 in more detail, balancing module 2100 comprises transistors 2101-2103. Transistor 2101 comprises terminal 21011 coupled to output node 2601, terminal 21012 coupled to power node 2710, and control terminal 21013 coupled to an input of balancing module 2100 to receive biasing signal 2001 from biasing module 2200 to actuate transistor 2101. Transistor 2102 comprises terminal 21021 coupled to output node 2601, terminal 21022 coupled to power node 2710, and control terminal 21023 coupled to an input of balancing module 2100 to receive signal 2002 from biasing module 2300 to actuate transistor 2102. Transistor 2103 comprises terminal 21031 coupled to power node 2720, terminal 21032 coupled to output node 2601, and control terminal 21033 also coupled to output node 2601.

In the present example, output node 2601 is coupled to an output terminal of balancing module 2100 to send biasing signal 2003 to target circuit 1500, such that biasing signal 2003 corresponds to the voltage at control terminal 21033 of transistor 2103. Biasing signal 2003 can thus be maintained substantially constant by maintaining $I_{sum}$ 2180 substantially constant as the sum of currents 2181-2182, as explained above. As biasing signal 2001 increases while biasing signal 2001 decreases, control terminal 21013 of transistor 2101 is actuated to increase the flow of balancing current 2181 through transistor 2101 while control terminal 21023 of transistor 2102 is actuated to decrease the flow of balancing current 2182 through transistor 2102.

In examples such as those shown for FIGS. 1-2, the balancing module can comprise a current mirror for its respective biasing modules. For example, balancing module 2100 comprises a current mirror for biasing modules 2200 and 2300, such that transistor 2101 comprises a portion of a current mirror for biasing module 2200, and transistor 2102 comprises a portion of a current mirror for biasing module 2300. The example of FIG. 2 shows transistors 2101 and 2102 as comprising n-type transistors, and transistor 2103 as comprising a p-type transistor. In some examples, power node 2720 may be referred to as Vdd, and/or may comprise a range of approximately 0V to approximately 30V. In the same or other examples, power node 2720 may be referred to as Vss, and/or may comprise a range of approximately 0V to approximately −30V. There can be examples where the magnitude of the difference between Vdd and Vss may be limited to approximately 30V.

In the example of FIG. 2, biasing module 2200 is shown as comprising an n-channel constant $g_m$ biasing topology, with resistance 2290, with transistors 2204 and 2205 as n-type transistors, and with transistors 2206 and 2207 as p-type transistors. Transistor 2204 comprises terminal 22041 coupled to node 26002, terminal 22042 coupled to power node 2710, and control terminal 22043 coupled to node 2602. Resistance 2290 comprises terminal 2291 coupled to power node 2710, and with terminal 2292 coupled to transistor 2205. Transistor 2205 comprises terminal 22051 coupled to node 2603, terminal 22052 coupled to terminal 2292 of resistance 2290, and control terminal 22053 coupled to node 2602. Transistor 2206 comprises terminal 22061 coupled to power node 2720, terminal 22062 coupled to node 2603, and control terminal 22063 coupled to node 2603. Transistor 2207 comprises terminal 22071 coupled to power node 2720, terminal 22072 coupled to node 2602, and control terminal 22073 coupled to node 2603. As can be seen in FIG. 2, node 2602 is coupled to balancing module 2100 to route biasing signal 2001 to control terminal 21013 of transistor 2101, and control terminals 22043, 22053, and 21013 of transistors 2204, 2205, and 2101, respectively, are coupled together via node 2602.

As also seen in the example of FIG. 2, biasing module 2300 comprises a p-channel constant $g_m$ biasing topology, with resistance 2390, with transistors 2208 and 2209 as n-type transistors, and with transistors 2210 and 2211 as p-type transistors. Transistor 2308 comprises terminal 23081 coupled to node 2604, terminal 23082 coupled to power node 2710, and control terminal 23083 coupled to node 2605. Resistance 2390 comprises terminal 2391 coupled to power node 2720, and terminal 2392 coupled to transistor 2310. Transistor 2309 comprises terminal 23091 coupled to node 2605, terminal 23092 coupled to power node 2710, and control terminal 23093 coupled to node 2605. Transistor 2310 comprises terminal 23101 coupled to terminal 2392 of resistance 2390, terminal 23102 coupled to node 2605, and control terminal 23103 coupled to node 2604. Transistor 2311 comprises terminal 23111 coupled to power node 2720, terminal 23112 coupled to node 2604, and control terminal 23113 also coupled to node 2604. As can be seen in FIG. 2, node 2605 is coupled to balancing module 2100 to route biasing signal 2002 to control terminal 21023 of transistor 2102, and control terminals 23083, 23093, and 21023 of transistors 2308, 2309, and 2102, respectively, are coupled together via node 2605.

Figure 4:
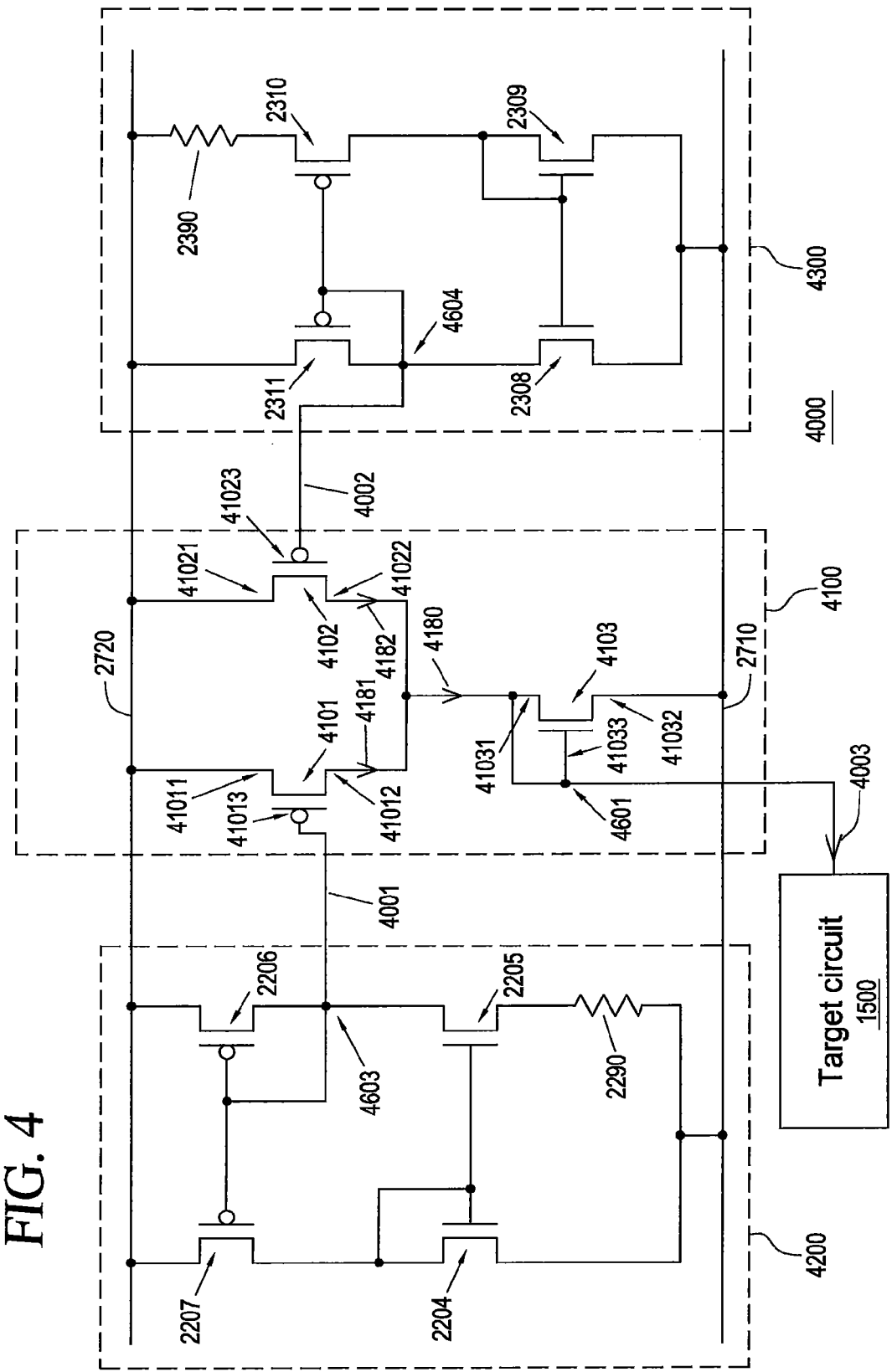
FIG. 4 illustrates a transistor level schematic of another biasing apparatus in accordance with the diagram of FIG. 1.

Continuing with the figures, FIG. 4 illustrates a diagram of biasing apparatus 4000 in accordance with the present disclosure. Biasing apparatus 4000 is similar to biasing apparatus 1000 (FIG. 1), sharing a similar architecture. For example, biasing module 4200 of biasing apparatus 2000 can be similar to biasing module 1200 of biasing apparatus 1000 in FIG. 1. Biasing module 4300 of biasing apparatus 2000 can be similar to biasing module 1300 of biasing apparatus 1000 in FIG. 1. Balancing module 4100 of biasing apparatus 2000 can be similar to balancing module 4100 of biasing apparatus 1000 in FIG. 1. In addition, biasing signals 4001-4003 can be respectively similar to biasing signals 1001-1003 of biasing apparatus 1000 in FIG. 1. Biasing apparatus 4000 can also be similar to biasing apparatus 2000 of FIG. 2, but with signals biasing 4001 and 4002 for balancing module 4100 based off the control terminals of the p-type transistors of biasing modules 4200 and 4300.

In the example of FIG. 4, balancing module 4100 comprises transistors 4101-4103, and is configured to generate biasing signal 4003 based on biasing signals 4001 and 4002 from biasing modules 4200 and 4300, respectively. Biasing signal 4003 is similar to biasing signals 1003 (FIG. 1), and 2003 (FIG. 2), configured to bias target circuit 1500 and/or a component thereof, such as an operation amplifier. Transistor 4101 comprises terminal 41011 coupled to power node 2720, terminal 41012 coupled to output node 4601, and control terminal 41013 coupled to an input of balancing module 4100 to receive biasing signal 4001 from biasing module 4200 to actuate transistor 4101. Transistor 4102 comprises terminal 41021 coupled to power node 2720, terminal 41022 coupled to output node 4601, and control terminal 41023 coupled to an input of balancing module 4100 to receive biasing signal 4002 from biasing module 4300 to actuate transistor 4102. Transistor 4103 comprises terminal 41031 coupled to output node 4601, terminal 41032 coupled to power node 2710, and control terminal 41033 coupled to output node 4601, where biasing signal 4003 is sent to target circuit 1500 from output node 4601.

Balancing module 4100 differs from balancing module 2100 (FIG. 2) in that transistors 4101 and 4102 are p-type transistors coupled to power node 2720, and in that transistor 4103 is an n-type transistor coupled to power node 2710. In addition, transistor 4101 receives biasing signal 4001 from node 4603 of biasing module 4200, where node 4603 is shared between the control terminals of p-type transistors 2206-2207. Similarly, transistor 4102 receives biasing signal 4002 from node 4604 of biasing module 4300, where node 4604 is shared between the control terminals of p-type transistors 2310-2311.

Balancing module 4100 is configured to maintain biasing signal 4003 substantially constant as transistors within biasing modules 4200 and 4300 degrade within respective ranges. For example, as transistors 2206-2207 and 2310-2311 degrade, biasing signal 4001 will decrease and biasing signal 4002 will increase, thereby increasing the flow of current 4181 through transistor 4101, and decreasing the flow of current 4182 through transistor 4102, such as to maintain $I_{sum}$ 4180 substantially constant in balancing module 4100, at least as long as current 4182 decreases proportionately with the increment in current 4181.

Figure 5:
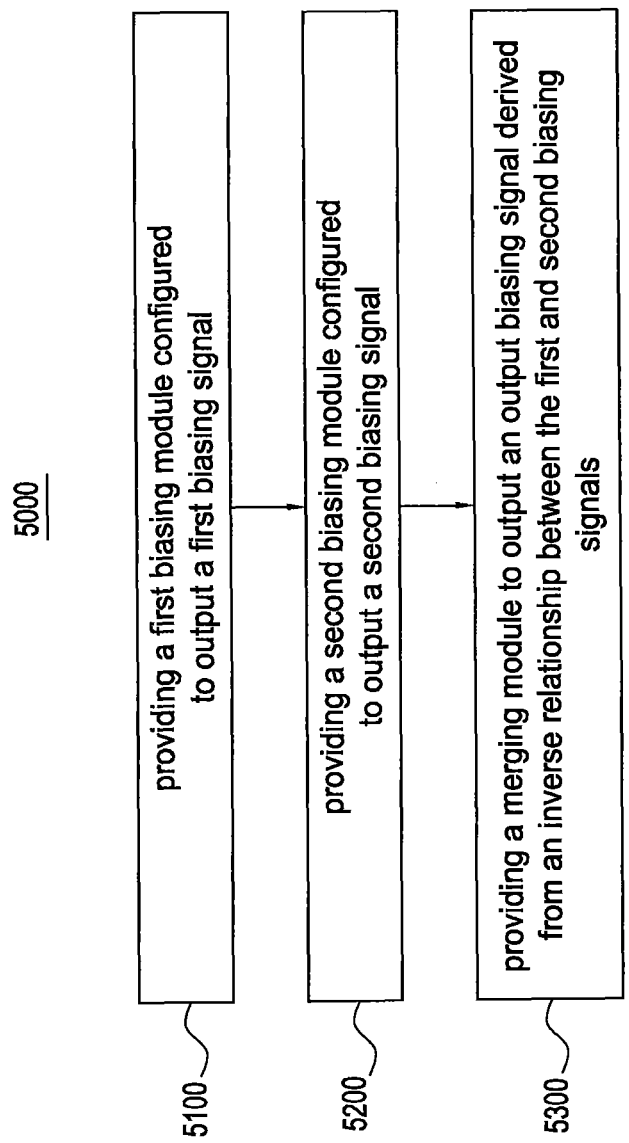
FIG. 5 illustrates a flowchart of method for providing a biasing apparatus

Forging ahead, FIG. 5 illustrates a flowchart of method 5000 for providing a biasing apparatus. In some examples, the biasing apparatus of method 5000 can be similar to biasing apparatus 1000 (FIG. 1), 2000 (FIG. 2), or 4000 (FIG. 4).

Block 5100 of method 5000 comprises providing a first biasing module configured to output a first biasing signal. In some examples, the first biasing module can be similar to biasing module 1200 (FIG. 1), 2200 (FIG. 2), or 4200 (FIG. 4). The first biasing module can comprise a biasing circuit, such as a constant $g_m$ biasing circuit, among other types, such that the first biasing signal output from the first biasing module increases as transistors of the first biasing module degrade. In some examples, the first biasing signal can be similar to biasing signal 1001 (FIG. 1), 2001 (FIG. 2), or 4001 (FIG. 4).

Block 5200 of method 5000 comprises providing a second biasing module configured to output a second biasing signal. In some examples, the second biasing module can be similar to biasing module 1300 (FIG. 1), 2300 (FIG. 2), or 4300 (FIG. 4). The first biasing module can comprise a biasing circuit, such as a constant $g_m$ biasing circuit, among other types, such that the second biasing signal output from the second biasing module decreases as transistors of the second biasing module degrade. In some examples, the second biasing signal can be similar to biasing signal 1002 (FIG. 1), 2002 (FIG. 2), or 4002 (FIG. 4).

Block 5300 of method 5000 comprises providing a balancing module to output an output biasing signal derived from an inverse relationship between the first and second biasing signals. In some examples, the balancing module can be similar to balancing module 1100 (FIG. 1), 2100 (FIG. 2), or 4100 (FIG. 4), and the output biasing signal can be similar to biasing signal 1003 (FIG. 1), 2003 (FIG. 2), or 4003 (FIG. 4). The output biasing signal can be used to bias a target circuit, such as target circuit 1500 (FIGS. 1, 2, 4) or for component(s) thereof, such for as one or more operational amplifiers. In some examples, the balancing module can be used to maintain the output biasing signal substantially constant, at least until transistor degradation in the second biasing module of block 5200 causes a magnitude of the second biasing signal to reach or be substantially proximate to zero. Accordingly, the use of the balancing module of block 5300 can restrict or delay the effects of transistor degradation on the output biasing signal, thereby increasing the lifetime of the biasing apparatus and/or of the target circuit.

In some examples, one or more of the different procedures of method 5000 can be combined into a single block or performed simultaneously, and/or the sequence of such blocks can be changed. For example, block 5200 could be performed before, or simultaneously with, procedure 5100 in some examples. In other examples, block 5300 can be performed before, or simultaneously with, one or both of blocks 5100 and/or 5200.

There can also be examples where method 5000 can comprise further or different procedures. As an example, method 5000 could comprise another block for providing a target circuit, such as target circuit 1500 (FIGS. 1, 2, 4), to be coupled to the biasing apparatus of method 5000 and/or to receive the output biasing signal of block 5300. In the same or other examples, two or more of the first biasing module, the second biasing module, the balancing module, and/or the target circuit could be provided and/or fabricated over the same substrate. Other variations can be implemented for method 5000 without departing from the scope of the present disclosure.

Although the complementary biasing circuits and related methods herein have been described with reference to specific embodiments, various changes may be made without departing from the spirit or scope of the present disclosure. For example, although biasing modules 2200, 2300, (FIGS. 2) 4200, and 4300 (FIG. 4) have been depicted herein as comprising constant $g_m$ biasing topologies, there can be other embodiments comprising other types of biasing topologies.

Additional examples of such changes or variations have been given in the foregoing description. Accordingly, the disclosure of embodiments herein is intended to be illustrative of the scope of the invention and is not intended to be limiting. It is intended that the scope of this application shall be limited only to the extent required by the appended claims. The embedded complementary biasing circuits and related methods discussed herein may be implemented in a variety of embodiments, and the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefit, advantage, solution, or element is expressly stated in the claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An apparatus comprising:
   a first biasing module configured to output a first biasing signal;
   a second biasing module configured to output a second biasing signal; and
   a balancing module comprising:
      a first input to receive the first biasing signal;
      a second input to receive the second biasing signal; and
      an output terminal to output to a target circuit an output biasing signal derived from the first and second biasing signals;
   wherein:
      the first biasing module comprises a first biasing transistor pair of n-type transistors;
      the second biasing module comprises a second biasing transistor pair of p-type transistors;
      a first current of the first biasing module increases when a first threshold voltage difference, between threshold voltages of the first biasing transistor pair, increases from exposure to a first gate voltage of the first biasing transistor pair; and
      a second current of the second biasing module decreases when a second threshold voltage difference, between threshold voltages of the second biasing transistor pair, increases from exposure to a second gate voltage of the second biasing transistor pair.

2. The apparatus of claim 1, wherein:
   the output biasing signal is kept substantially constant by the balancing module while the second biasing signal decreases and the first biasing signal increases substantially proportional to each other.

3. The apparatus of claim 1, wherein:
   the balancing module and the first and second biasing modules comprise thin film transistors.

4. The apparatus of claim 1, wherein:
   the target circuit comprises an operational amplifier configured to be biased by the output biasing signal.

5. The apparatus of claim 1, wherein:
   the first biasing module comprises an n-channel $g_m$ biasing topology; and
   the second biasing module comprises a p-channel $g_m$ biasing topology.

6. The apparatus of claim 1, wherein:
   the balancing module is configured to generate a sum current from a sum of:
      a first balancing current controlled by the first biasing signal; and
      a second balancing current controlled by the second biasing signal.

7. The apparatus of claim 6, wherein:
   when the first balancing current increases within as first current range and when the second balancing current decreases within a second current range:
      the sum current is maintained substantially constant by the balancing module to maintain the output biasing signal substantially constant.

8. The apparatus of claim 1, wherein:
   the p-type transistors comprise a pentacene material; and
   the n-type transistors comprise at least one of:
      an amorphous silicon material; or
      an indium zinc oxide material.

9. The apparatus of claim 1, wherein:
   the first biasing transistor pair comprises first and second n-type transistors;
   the second biasing transistor pair comprises first and second p-type transistors;
   when the first biasing transistor pair is exposed to a first gate voltage:
      a threshold voltage of the first n-type transistor increases more than a threshold voltage of the second n-type transistor such that:
         the first n-type transistor becomes increasing v more difficult to turn on than the second n-type transistor; and
         the first biasing signal is increased;
   and
   when the second biasing transistor pair is exposed to a second gate voltage:
      a threshold voltage of the first p-type transistor increases more than a threshold voltage of the second p-type transistor such that:
         the first p-type transistor becomes increasingly less difficult to turn on than the second p-type transistor; and
         the second biasing signal is decreased.

10. The apparatus of claim 1, wherein:
    the balancing module comprises:
       a first transistor comprising:
          a first terminal coupled to an output node;
          a second terminal coupled to a first power node; and
          a control terminal coupled to the first input of the balancing module and actuatable by the first biasing signal from the first biasing module;
       a second transistor comprising:
          a first terminal coupled to the output node;
          a second terminal coupled to the first power node; and
          a control terminal coupled to the second input of the balancing module and actuatable by the second biasing, signal from the second biasing module;
       and
       a third transistor comprising:
          a first terminal coupled to a second power node;
          a second terminal coupled to the output node; and
          a control terminal coupled to the output node;

the output terminal of the balancing module is coupled to the output node and the control terminal of the third transistor;
the first and second transistors comprise n-type transistors; and
the third transistor comprises a p-type transistor.

11. The apparatus of claim 10, wherein:
a sum current through the third transistor comprises:
   a first balancing current through the first transistor; and
   a second balancing current through the second transistor;
while the second biasing signal decreases and the first biasing signal increases substantially proportional to each other, the balancing module is configured to:
   actuate the control terminal of the first transistor to increase the first balancing current through the first transistor,
   actuate the control terminal of the second transistor to decrease the second balancing current through the second transistor, and
   maintain the output biasing signal substantially constant.

12. The apparatus of claim 10, wherein:
the first transistor of the balancing module comprises a portion of a first current minor for the first biasing module; and
the second transistor of the balancing module comprises a portion of a second current mirror for the second biasing module.

13. The apparatus of claim 10, wherein:
the first biasing module comprises:
   a fourth transistor comprising:
      a first terminal coupled to a first node;
      a second terminal coupled to the first power node; and
      a control terminal coupled to the first node;
   a first resistor comprising:
      a first terminal coupled to the first power node; and
      a second terminal;
   a fifth transistor comprising:
      a first terminal coupled to a second node;
      a second terminal coupled to the second terminal of the first resistor; and
      a control terminal coupled to the first node;
   a sixth transistor comprising:
      a first terminal coupled to the second power node;
      a second terminal coupled to the second node; and
      a control terminal coupled to the second node;
   and
   a seventh transistor comprising:
      a first terminal coupled to the second power node;
      a second terminal coupled to the first node; and
      a control terminal coupled to the second node;
the first node is coupled to the first input of the balancing module to route the first biasing signal to the control terminal of the first transistor;
the fourth and fifth transistors comprise n-type transistors; and
the sixth and seventh transistors comprise p-type transistors.

14. The apparatus of claim 13, wherein:
the second biasing module comprises:
   an eighth transistor comprising:
      a first terminal coupled to a third node;
      a second terminal coupled to the first power node; and
      a control terminal coupled to a fourth node;
   a second resistor comprising:
      a first terminal coupled to the second power node; and
      a second terminal;
   a ninth transistor comprising:
      a first terminal coupled to the fourth node;
      a second terminal coupled to the first power node; and
      a control terminal coupled to the fourth node;
   a tenth transistor comprising:
      a first terminal coupled to the second terminal of the first resistor;
      a second terminal coupled to the fourth node; and
      a control terminal coupled to the third node;
   and
   a eleventh transistor comprising:
      a first terminal, coupled to the second power node;
      a second terminal coupled to the third node; and
      a control terminal coupled to the third node;
the fourth node is coupled to the second input of the balancing module to route the second biasing signal to the control terminal of the second transistor;
the eighth and ninth transistors comprise n-type transistors; and
the tenth and eleventh transistors comprise p-type transistors.

15. The apparatus of claim 1, wherein:
the balancing module comprises:
   a first transistor comprising:
      a first terminal coupled to a first power node;
      a second terminal coupled to an output node; and
      a control terminal coupled to the first input of the balancing module and actuatable by the first biasing signal from the first biasing module;
   a second transistor comprising:
      a first terminal coupled to the first power node;
      a second terminal coupled to the output node; and
      a control terminal coupled to the second input of the balancing module and actuatable by the second biasing signal from the second biasing module;
   and
   a third transistor comprising:
      a first terminal coupled to the output node;
      a second terminal coupled to a second power node; and
      as control terminal coupled to the output node;
and
the output terminal of the balancing module is coupled to the output node and the control terminal of the third transistor;
the first and second transistors comprise p-type transistors; and
the third transistor comprises an n-type transistor.

16. The apparatus of claim 15, wherein:
the first biasing module comprises:
   a fourth transistor comprising:
      a first terminal coupled to a first node;
      a second terminal coupled to the second power node; and
      a control terminal coupled to the first node;
   first resistor comprising:
      a first terminal coupled to the second power node; and
      a second terminal;
   a fifth transistor comprising:
      a first terminal coupled to a second node;
      a second terminal coupled to the second terminal of the first resistor; and
      a control terminal coupled to the first node;
   a sixth transistor comprising:
      a first terminal coupled to the first power node;
      a second terminal coupled to the second node; and
      a control terminal coupled to the second node;

and
a seventh transistor comprising:
a first terminal, coupled to the first power node;
a second terminal coupled to the first node; and
a control terminal coupled to the second node;
the second node is coupled to the first input of the balancing, module to route the first biasing signal to the control terminal of the first transistor;
the fourth and fifth transistors comprise n-type transistors; and
the sixth and seventh transistors comprise p-type transistors.

17. The apparatus of claim 16, wherein:
the second biasing module comprises:
an eighth transistor comprising:
a first terminal coupled to a third node;
a second terminal coupled to the second power node; and
a control terminal coupled to a fourth node;
a second resistor comprising:
a first terminal coupled to the first power node; and
a second terminal;
a ninth transistor comprising:
a first terminal coupled to the fourth node;
a second terminal coupled to the second power node; and
a control terminal coupled to the fourth node;
a tenth transistor comprising:
a first terminal coupled to the second terminal of the second resistor;
a second terminal coupled to the fourth node; and
a control terminal coupled to the third node;
and
a eleventh transistor comprising:
a first terminal, coupled to the first power node;
a second terminal coupled to the third node; and
a control terminal coupled to the third node;
the third node is coupled to the second input of the balancing module to route the second biasing signal to the control terminal of the second transistor;
the eighth and ninth transistors comprise n-type transistors; and
the tenth and eleventh transistors comprise p-type transistors.

18. A method comprising:
providing a first biasing module configured to output a first biasing signal;
providing a second biasing module configured to output a second biasing signal; and
providing a balancing module to output an output biasing signal derived from an inverse relationship between the first and second biasing signals;
wherein:
providing the first biasing module comprises:
providing a first n-type constant-$g_m$ biasing circuit configured to increase a magnitude of the first biasing signal when exposed to a first gate voltage;
and
providing the second biasing module comprises:
providing a second p-type constant-$g_m$ circuit configured to decrease a magnitude of the second biasing signal when exposed to a second gate voltage.

19. The method of claim 18, wherein:
the balancing module, and the first and second biasing modules, comprise thin film transistors; and providing the balancing module comprises:
providing the balancing module to keep the output biasing signal substantially constant while the second biasing signal decreases and the first biasing signal increases substantially proportional to each other.

20. The method of claim 18, wherein:
providing the balancing module comprises:
providing the output biasing signal for biasing an operational amplifier circuit.

21. The method of claim 18, wherein:
providing the first biasing module comprises:
providing a first biasing transistor pair of first and second n-type transistors configured to degrade, when exposed to a first gate stress voltage, such that:
the first n-type transistor becomes increasingly more difficult to turn on than the second n-type transistor; and
the first biasing signal is increased;
and
providing the second biasing module comprises:
providing a second biasing transistor pair of first and second p-type transistors configured to degrade, when exposed to a second gate stress voltage, such that:
the first p-type transistor becomes increasingly less difficult to turn on than the second p-type transistor; and
the second biasing signal is decreased.

22. The method of claim 18, wherein:
providing the balancing module comprises:
providing the balancing module to generate a sum current by summing:
a first current controlled by the first biasing signal; and
a second current controlled by the second biasing signal;
and
the sum current is configured to control a magnitude of the output biasing signal.

23. The method of claim 18, wherein:
providing the balancing module comprises:
providing to first transistor comprising:
a first terminal coupled to an output node;
a second terminal coupled to a first power node; and
a control terminal coupled to a first input of the balancing module and actuatable by the first biasing signal from the first biasing module;
providing a second transistor comprising:
a first terminal coupled to the output node;
a second terminal coupled to the first power node; and
a control terminal coupled to a second input of the balancing module and actuatable by the second biasing signal from the second biasing module;
and
providing a third transistor comprising:
a first terminal coupled to a second power node;
a second terminal coupled to the output node; and
a control terminal coupled to the output node;
the output terminal of the balancing module is coupled to the output node and to the control terminal of the third transistor;
the first and second transistors comprise n-type transistors; and
the third transistor comprises a p-type transistor.

24. The method of claim 23, wherein:
providing the first transistor of the balancing module comprises:
providing a portion of a first current mirror for the first biasing module;

and
providing the second transistor of the balancing module comprises:
providing a portion of a second current mirror for the second biasing module.

25. The method of claim 23, wherein:
providing the third transistor of the balancing module comprises:
providing the third transistor to mute a sum current comprising:
a first balancing current through the first transistor; and
a second balancing current through the second transistor;
providing the first transistor comprises;
providing the control terminal of the first transistor to increase the first balancing current through the first transistor as the first biasing signal increases;
and
providing the second transistor comprises:
providing the control terminal of the second transistor to decrease the second balancing current through the second transistor as the second biasing signal decreases substantially proportional to the increase of the first biasing signal.

26. An apparatus comprising:
a first biasing module configured to output a first biasing signal;
a second biasing module configured to output a second biasing signal; and
a balancing module coupled between the first and second biasing modules to output an output biasing signal derived from the first and second biasing signals;
wherein:
the first and second biasing modules comprise n-type and p-type thin film transistors susceptible to threshold voltage degradation;
the first biasing module comprises an n-channel $g_m$ biasing topology, with a first biasing transistor pair of the n-type thin film transistors;
the second biasing module comprises a p-channel $g_m$ biasing topology, with a second biasing transistor pair of the p-type thin film transistors;
a first threshold voltage difference, between threshold voltages of the first biasing transistor pair, is configured to increase when the first biasing transistor pair is exposed to a first gate stress voltage such as to make the first biasing transistor pair increasingly more difficult to turn on;
a second threshold voltage difference, between threshold voltages of the second biasing transistor pair, is configured to decrease when the second biasing transistor pair is exposed to a second gate stress voltage such as to make the second biasing transistor pair increasingly less difficult to turn on;
the first biasing module is configured to increase the first biasing signal in magnitude as the first threshold voltage difference increases;
the second biasing module is configured to decrease the second biasing signal in magnitude as the second threshold voltage difference decreases;
the balancing module is configured to generate a sum current from a sum of:
a first current controlled by the first biasing signal; and
a second current controlled by the second biasing signal;
the sum current remains substantially constant as the first biasing signal increases while the second biasing signal decreases substantially proportional to each other; and
the output biasing signal remains substantially constant while the sum current remains substantially constant.

27. The apparatus of claim 26, wherein:
the balancing module is configured to couple to an operating amplifier to bias the operating amplifier via the output biasing signal;
the balancing module, the first biasing module, and the second module comprise:
p-type transistors comprising a pentacene material; and
n-type transistors comprising at least one of:
an amorphous silicon material; or
an indium zinc oxide material;
the p-type transistors comprise the p-type thin film transistors; and
the n-type transistors comprise the n-type thin film transistors.

* * * * *